United States Patent [19]

Shimizu

[11] Patent Number: 4,632,718
[45] Date of Patent: Dec. 30, 1986

[54] FRAME SEPARATOR WITH POSITIONING PIN

[75] Inventor: Katsuo Shimizu, Urawa, Japan

[73] Assignee: Seiei Kohsan Co., Ltd., Urawa, Japan

[21] Appl. No.: 828,597

[22] Filed: Feb. 11, 1986

Related U.S. Application Data

[63] Continuation-in-part of Ser. No. 621,790, Jun. 18, 1984, abandoned.

[51] Int. Cl.$^4$ ............................................. B32B 31/16
[52] U.S. Cl. .................................. 156/352; 156/344; 156/584; 269/315; 271/131; 271/262
[58] Field of Search ............... 156/344, 352, 362–364, 156/584; 269/53, 315; 271/131, 262

[56] References Cited

U.S. PATENT DOCUMENTS

| | | | |
|---|---|---|---|
| 1,151,792 | 8/1915 | Jaeger | 271/131 X |
| 1,247,846 | 11/1917 | Lane | 271/131 |
| 2,750,188 | 6/1956 | Rouan | 271/262 |
| 3,194,554 | 7/1965 | Hilpman et al. | 271/262 |
| 3,778,051 | 12/1973 | Allen et al. | 271/262 |

FOREIGN PATENT DOCUMENTS

| | | | |
|---|---|---|---|
| 84334 | 6/1921 | Austria | 271/131 |
| 831875 | 1/1970 | Canada | 271/131 |
| 2065616 | 7/1981 | United Kingdom | 272/131 |

*Primary Examiner*—Robert A. Dawson
*Attorney, Agent, or Firm*—Browdy and Neimark

[57] ABSTRACT

The invention proposes a device designed for separating IC lead frames, boards, etc., piece by piece, and loading them continuously, and composed of a work stocker which holds laminated work of strips; a work-pressing mechanism which continuously presses the work within the work stocker; a separating mechanism which strips away the laminated work piece by piece from the lowest part thereof; and a pusher mechanism which pushes outside the stripped work from the work stocker; and wherein the separating mechanism is installed with a detector which finds out double sheets of the strips and stops operation of the pusher; and the separator is installed at its work exit end with a positioning pin of go-in-and-out of a taper shape which positions end points of the work pushed out by the pusher.

4 Claims, 17 Drawing Figures

FRAME SEPARATOR WITH POSITIONING PIN

CROSS-REFERENCE TO RELATED APPLICATION

The present application is a Continuation-in-part of U.S. Application Ser. No. 621,790, filed June 18, 1984, now abandoned, the entire contents of which are hereby incorporated by reference.

FIELD OF THE INVENTION

This invention relates to a device designed for separating laminated IC lead frames, boards, etc., piece by piece and conveying them continuously, and more particularly relates to a device which automatically strips away a blocklayer of LSI and IC lead frames having a somewhat uneven surface layer by layer (work) from a work stocker.

BACKGROUND OF THE INVENTION

Conventional devices which are equipped with a vacuum sucker have been inaccurate in operation and often caused to the surface of the work, and therefore unsuitable to incorporation into an automatic line.

SUMMARY OF THE INVENTION

It is an object of the invention to provide a device which separates exactly and automatically the work of the closely laminated lead frames, boards, etc., piece by piece.

It is another object of the invention to provide a device which may automatically detect and treat faults caused during separating and conveying the work.

It is a further object of the invention to provide a device which is accurate in operation and may be easily incorporated into an automatic line.

DETAILED DESCRIPTION OF THE PREFERRED EMBODIMENTS

The present invention is concerned with a frame separator which is composed of a work stocker which holds laminated work of strips; a work-pressing mechanism which continuously presses the laminated work within the work stocker; a separating mechanism which strips away the laminated work piece by piece from the lowest part thereof; and a pusher mechanism which pushes outside the stripped work from the work stocker; and wherein the separating mechanism is installed with a detector which finds out double sheets of the strips and stops operation of the pusher; and the separator is equipped at its work exit end with a taper shaped positioning pin which positions end points of the work pushed out by the pusher.

The attached drawings illustrate the most preferred embodiment of the invention.

Figure 1:
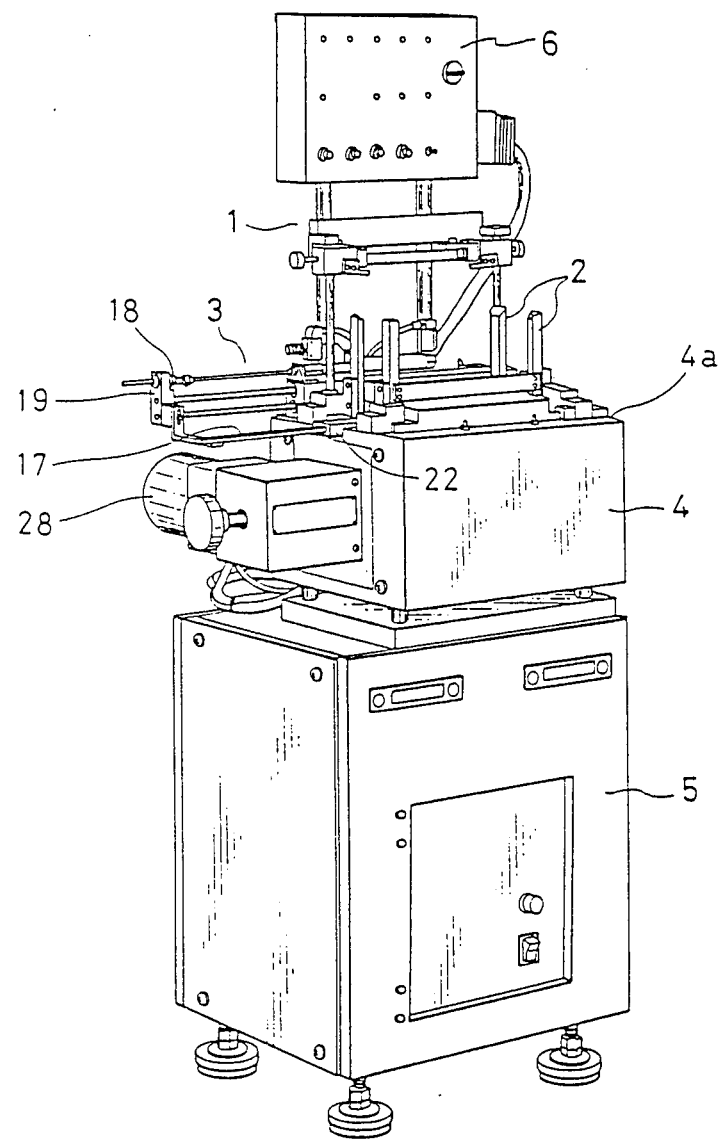
FIG. 1 is a whole perspective view of a device according to the invention.

FIG. 1 shows an outside and perspective view of a device according to the invention, and illustrates a work pressure mechanism 1, a work stocker 2, a pusher mechanism 3, a separating mechanism 4, a bed 5, and an operating panel 6. The work pressure mechanism 1 presses a laminated work 8 within the work stocker 2 for providing an exact separating operation.

Figure 2:
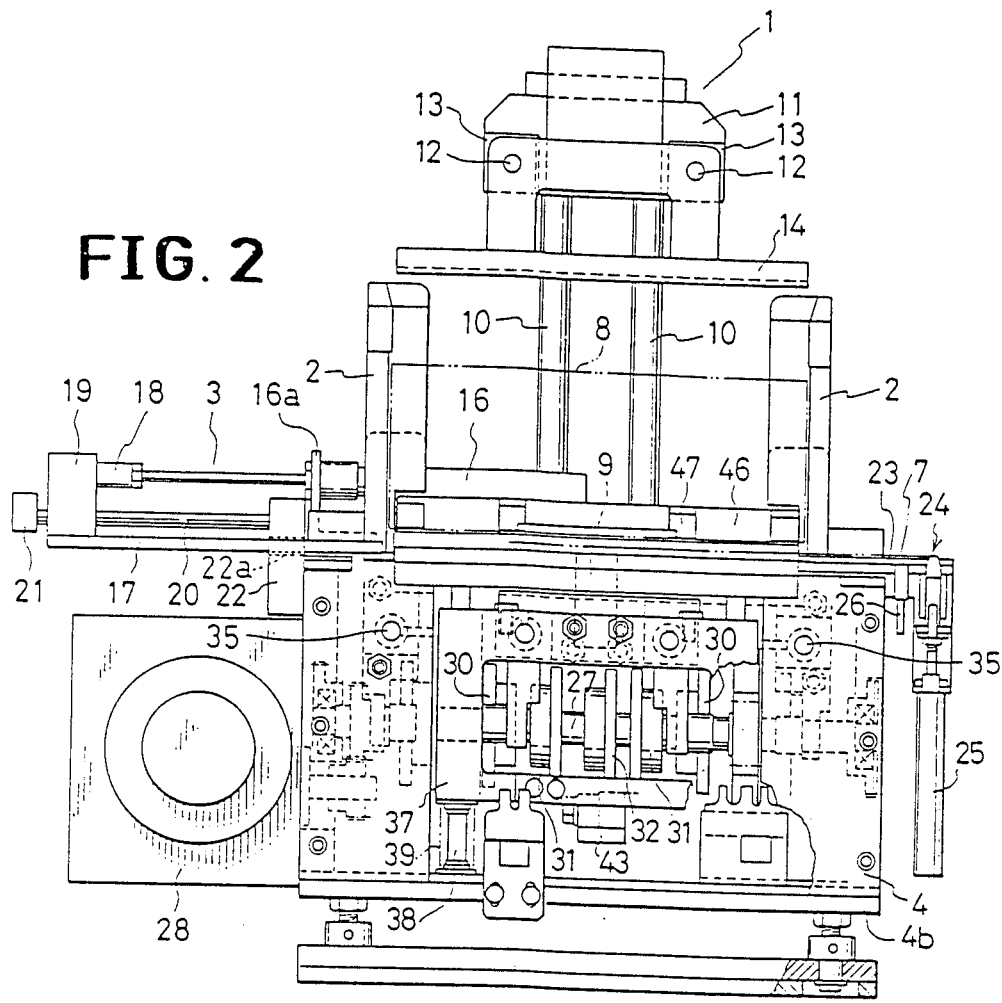
FIG. 2 is a front side view of the invention.
Figure 3:
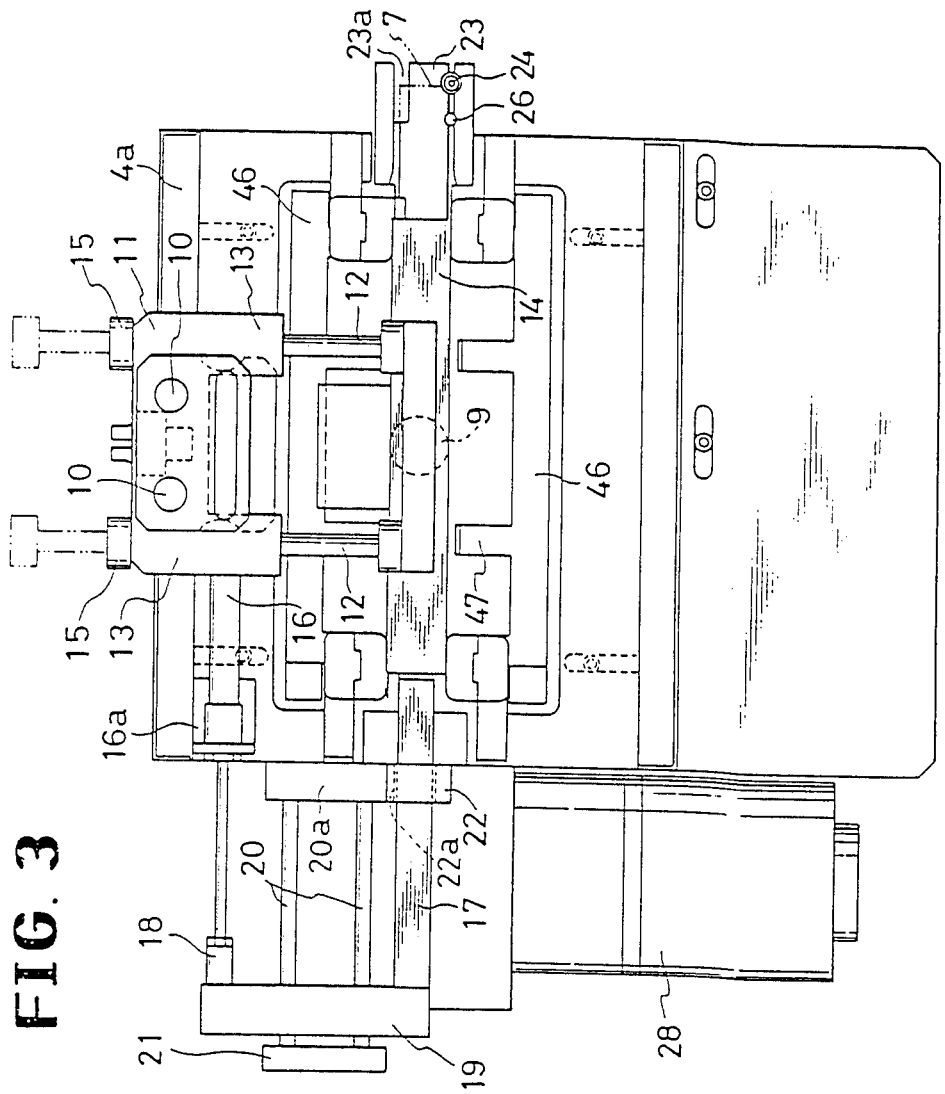
FIG. 3 is a plan view of the invention.
Figure 8:
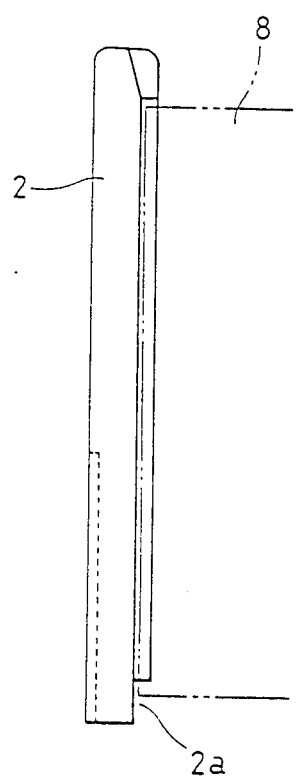
FIG. 8 shows a work stocker.

An explanation will be made to an actual embodiment with reference to FIGS. 2 and 3. Reference numerals 10, 10 are guide posts provided on a top panel 4a of the separating mechanism 4, and an elevating block 11 is vertically movable thereto. The elevating block 11 is provided with a couple of sliding tubes 13 for slidably inserting arms 12 laterally. The arms 12 suspend and position a pressure plate 14 from their ends, which has the same dimension as the work 7, while the stoppers 15 in flange shape are secured at the rear ends of the arms 12, and prevent the arms 12 from slipping down from the elevating block 11. The shown pressure plate 14 is rectangular and is positioned within the work stocker 2, and goes down, as pressing the laminated work due to its own weight from the upper side, in association with the elavating block 11 going down along the guide posts 10, 10. When supplying the laminated work 8, it goes upward in association with the elevating block 11 which is moved upward by the manual operation along the guide posts 10, 10, and it is released from the work stocker 2. Instead of the manual operation, such a manner may be adopted that a screw shaft is installed which is rotated intermittently by a stepping motor, and the elevating block 11 is formed with a female screw for engaging with said screw shaft, so that the pressure plate 14 is vertically moved up automatically for reloading laminated work 8. The work stocker 2 comprises four standing members which are L-shaped in cross section, and hold only four corners of the laminated frame 8. Therefore, blank is between the work stockers 2, 2. The work stocker is formed, at its lower part, with a hole 2a for passing the separated work 7 (refer to FIG. 8).

A next reference will be made to the pusher mechanism 3 with FIGS. 2 and 3. Reference numeral 16 is a cylinder for reciprocating a pusher 17, which is provided to the top plate 4a of the separator 4 by means of a cylinder bracket 16a and connects an end of a cylinder rod to a pusher holder 19 via an adjuster 18. The pusher 17 is plain and is secured at a lower side of the end of the pusher holder 19 into which a pair of guide rods 20 are slidable and stable thereby. Guide rods 20 are connected at their outsides via a stopper 21 and fixed to a slide guide 20a at their insides, which are provided at an upper side of a side wall of the separator 4. The pusher guide 22 which supports movement of the pusher 17 is formed with guide holes 22a for reciprocating the pusher 17 in the lateral direction.

Figure 9:
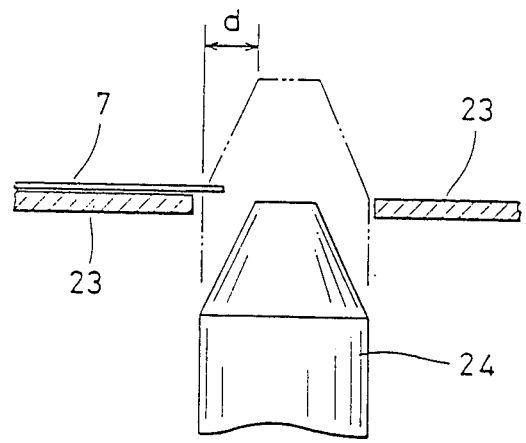
FIG. 9 shows operations of a positioning pin.

Reference numeral 23 is a chute on which the work 7 pushed by the pusher 17 gets at its front end, and a positioning pin 24 goes in and out at the end point of the chute 23. The positioning pin 24 is tapered as seen in FIG. 2 and moved vertically by a cylinder 25 installed under the chute 23. The end part of the work 7 pushed out by the pusher 17 is determined to be set within a space d shown in FIG. 9. In such a manner, when the positioning pin 24 is moved upward, the end part of the work 7 contacts an oblique face of the positioning pin 24. The chute 23 is formed with a cutout 23a. The cutout 23a is served in that an stripped work 7 moving means (not shown) comes under the cutout and inserts a catching pin in a hole opened in the end edge of the work 7 for moving in out of the work stocker 2. A detector of double sheets of the work is installed in the frame separator 4.

Figure 4:
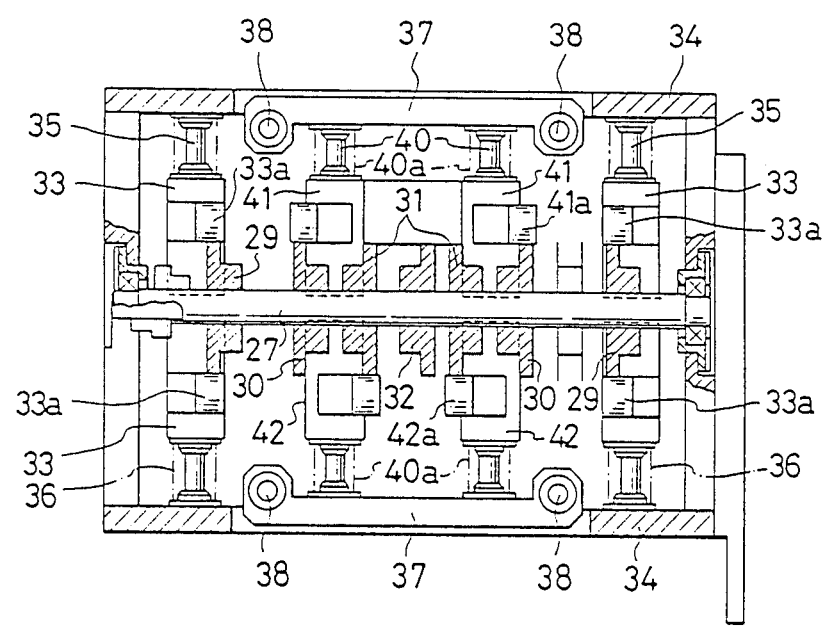
FIG. 4 is a bottom view of a frame separator.

A structure of the frame separator 4 will be explained with reference to FIGS. 2 to 6. In the separator 4, upper and lower chuck have pawls for delaminating the work 7, and they are regularly opened and closed by means of cam mechanism. Reference numeral 27 in FIG. 2 is a cam shaft to be rotated by a speed control motor 28, which is secured with upper chuck cams 29, right lower chuck cams 30, left lower chuck cams 31, and an elevating cam 32. Those cams are balanced in that the elevating cam 32 is centrally disposed with the left lower chuck cams 31, 31 at the both sides, the right lower chuck cams 30, 30 at their outsides, and the upper chuck cams 29, 29 at their further outsides (refer to FIG. 4). Reference numerals 33, 33 are upper chuck holders having cam followers 33a, 33a for connecting the upper chuck cams 29, 29 to chuck holders 33, 33. The upper chuck holders 33, 33 are slidable along a slide guide 35 bridging between side plates 34. Springs 36 are mounted on the both sides of slide guides 35, normally pressing the upper chuck holders 33, 33 to the inner side, i.e., toward the cam shaft 27 and pressing the cam followers 33a, 33a to the upper chuck cams 29, 29. In FIGS. 2 and 4, elevating plates 37, 37 are provided at the left and right of the separator 4 for sliding supports 38, 38 between the top plate 4a and a bottom plate 4b. The elevating plates 37 are normally pushed upward along supports 38 by means of springs 39 provided at lower ends of the supports 38 (FIG. 2). Between the elevating plates 37, 37, slide guides 40, 40 are provided. Numeral 41 designates right lower chuck holders which are inserted with the slide guides 40, 40, and said holders 41, 41 are slidable on the slide guides 40, 40. The holders 41 have cam followers 41a which follow against right lower chuck cams 30. Numeral 42 designates left lower chuck holders which are inserted with the slide guides 40, 40, and said holders 42 are slidable on the slide guides 40. The holders 42 have cam followers 42a which follows against left lower chuck cams 32. The lower chuck holders 41, 42 are normally pressed by a spring 40a against the cams 30, 31. A connector 43 connects to the elevating plates 37 at their lower parts and is provided with a cam follower 43a contacting an elevating cam 32 for elevating the plates 37. In FIG. 4, lower pawl bases 44 are secured on the lower chuck holders 41, 42 having lower pawls 45. A distance between the upper surface of the base 44 and the pointed end of the pawl 45 is equal to a thickness of a piece of the stripped work 7. Upper pawl bases 46 are secured on the upper chuck holders 33 and have upper pawls 47 on which the laminated work 8 will be placed.

Figure 10:
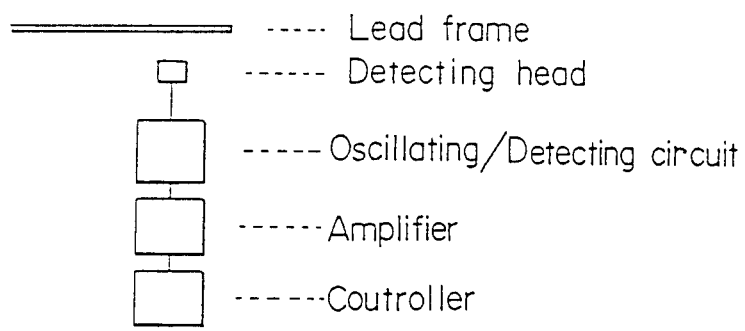
FIG. 10 is an outlined structure of a double sheet detector.

A detecting head 9 of the double sheet detector positions its head slightly under the work 7 on the lower pawl base 4, and fixes it to either of left or right lower chuck holders. The double sheet detector comprises a detecting coil including a coil whose inductance is changed by thickness of the lead frame or warp thereof, an oscillating/wave detecting circuit which detects changes of the inductance as changes of the oscillation frequency, an amplifier which amplifies outputs of the oscillating/wave detecting circuit, and a controller which controls another circuit by means of outputs issued from the amplifier (FIG. 10). If the thickness of the lead frame is larger than the normal one, in general the inductance of the detecting coil increases and the oscillation frequency of the oscillating circuit decreases. Since the tuning frequency of the wave detecting circuit has been in advance adjusted at a certain value, and if the oscillation frequency of the oscillator is changed, the wave detecting output is changed. With respect to the relation between the changes of the inductance and the wave detecting output, the wave detecting output is increased or decreased in accompany with the increase of the inductance by setting of the tuning frequency of the wave detecting circuit. That is, the changes in the conditions of the lead frame may be easily detected at high sensitivity by use of a variable frequency oscillator which uses, as a part of the oscillating coil, a search coil in the detecting head and a wave oscillating circuit of a tuning type.

The laminated work 8 is set in the work stocker 2 in that the elevating block 11 is lifted along the guide posts 10, 10 by mechanical or manual force, thereby to lift the pressure plate 14, and the pressure plate 14 is pressed laterally. Then a couple of the arms 12 slide backward within the tubes 13 (phantom line in FIG. 3) and the pressure plate 14 is got out from the work stocker 2. Accordingly, the laminated work 8 can be charged within the work stocker 2 from the upper side. The pressure plate 14 is pulled out and after then moved moderately down on the laminated work 8. The stoppers 15 are positioned at the rear end of the arms 12, so that the pressure plate 14 may be pulled out till the normal position. Thereafter, the pressure plate 14 continuously presses the work 8 by its own weight.

Figure 5:
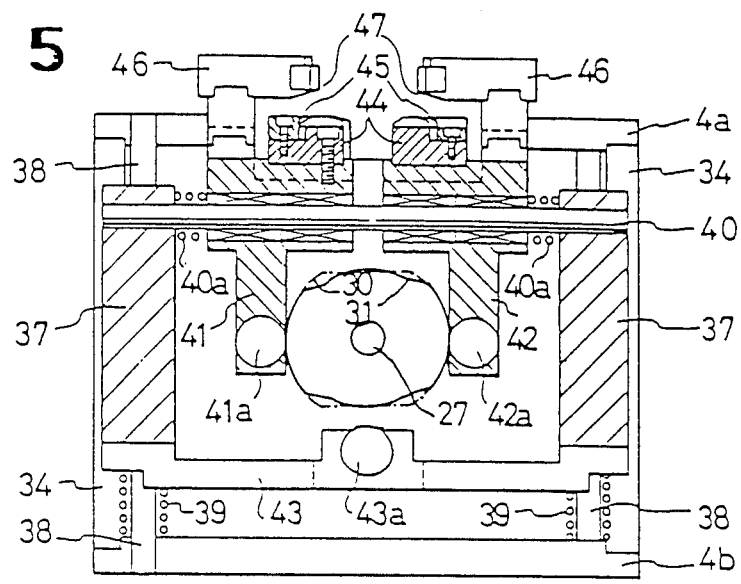
FIGS. 5 and 6 are vertical and cross sectional views of the frame separator, showing different positions.
Figure 6:
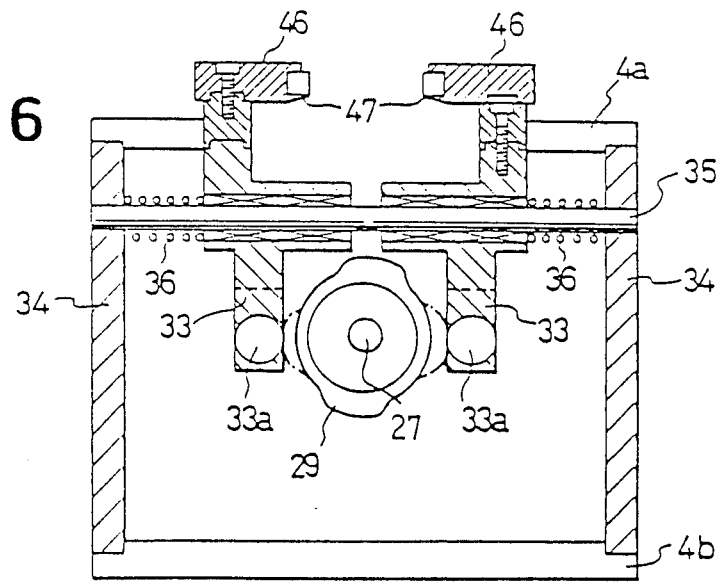
Figure 7:
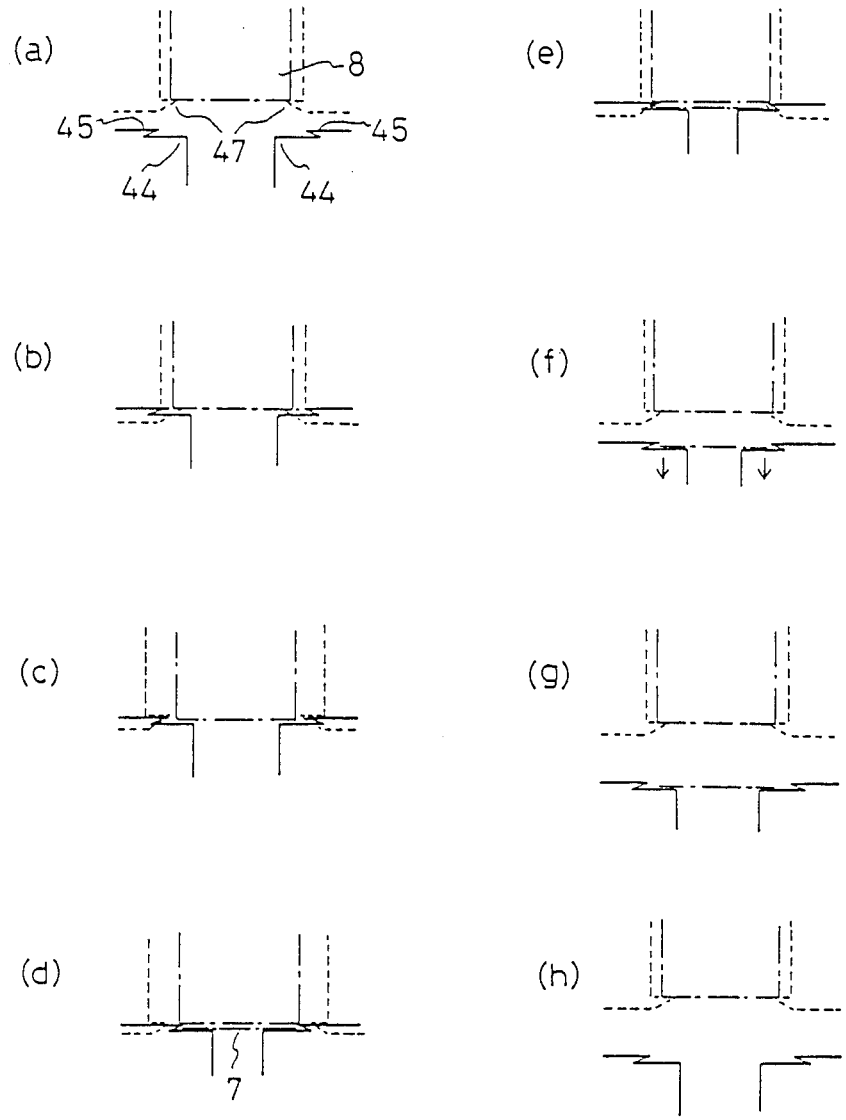
FIG. 7 is an explanatory view of separating operation.

A next reference will be made to separation of the laminated work piece by piece. In FIG. 5, the lower chuck holders 41, 42 are mounted on the slide guide 40, 40 between the elevating plates 37, and they are moved vertically in accordance with actuation of the elevating plates 37. That is, when the elevating cam 32 does not act to push down the cam follower 43a, the plate 37 is pushed by the spring 39, and the lower holders 41, 42 are lifted up. Then due to the profiling relation between the lower chuck cams 30, 31 and the cam followers 41a, 42a, the lower chuck holders 41,42 compress and move outside the spring 40a, and open (FIG. 7(b)). On the other hand, since the upper chuck holders 33, 33 are not influenced with action to push outside along guide 35 (the upper chuck cams 29, 29 are as shown in solid lines in FIG. 6), they are pushed inward by the springs 36 and shut (FIG. 7(b)). Subsequently, if the upper chuck cams 29 progress in rotation in accompany with rotation of the cam shaft 27 (the upper chuck cams 29, 29 as shown in dotted lines in FIG. 6), the upper chuck holders 33, 33 are opened outward via the cam followers 33a. Then the laminated work 8 on the upper pawls 47 moves on the lower pawl bases 44 (FIG. 7(c)). The lower pawl bases 44 are opened since the left and right lower chuck cams 30, 31 act on the cam followers 41a, 42a, but when this action is released, the lower chuck holders 41, 42 are pushed inward by the springs 40a, and shut. As a result, since the space between the lower pawl base 44 and the end of the lower pawl 45 is equal to the thickness of one piece of the work, the lower pawl 45 enters between the lowest work and the work on it, and separates the lowest work 7 (FIG. 7(d)). Thereby the separated work 7 stays on the lower pawl base 44 under the chucked condition, and the other laminated frames 8 exist on the lower pawl 45. When the action of the upper chuck cam 29 to the cam follower 33a is finished under such a condition (returning to the condition of the solid line in FIG. 6), the upper chuck holders 33, 33 are pushed inward by the springs 36 and closed, and the upper pawl 47 at the same level as the lower pawl 45 enters under the laminated work 8 and receives it (FIG. 7(e)). When the elevating cam 32 acts on the cam follower 43a, the lower chuck holders 41, 42 are moved down via the connector 43, the elevating plate 37 and the slide guides 40 (FIG. 7(f)). At the same time, the lower chuck cams 30, 31 act on the cam followers 41a, 42a to open the lower chuck holders 41, 42. Then the separated work 7 is made free on the lower pawl base 44 (FIG. 7(g)). The cylinder 16 is worked to advance the pusher 17 within the work stocker 2 and to push the work 7 on the lower pawl base 44 outside of the work stocker 2 (FIG. 7(h) and (a)). The pushing amount is adjusted by an adjuster 18. On retreat of the pusher 17, the cylinder 25 is worked to lift the positioning pin 24. The positioning pin is tapered, the tapered part of which the work 7 contacts on at its end during lifting of the pin 24, and the work 7 along the tapering obliquity as the pin 24 lifts, and it is set at a determined position (see FIG. 9). If two pieces of the work are separated by error, the detector finds it out and stops the operation of the cylinder 16. The work delaminated properly is got out by a work moving means (not shown), and when its rear end passes on the sensor 26, the initial operation is begun in response to a signal from the sensor 26. The above mentioned continuous operation is made per one rotation of the cam shaft 27, and every time the cam shaft 27 is rotated, the delaminated work 7 is pushed out. The same operation as mentioned above is repeated.

The invention is as mentioned above, and the closely laminated work is exactly separated automatically piece by piece. If any separation is made by error, it is detected automatically so that the operation is smooth and efficient, and this is easily incorporated into the automatic line.

I claim:

1. A frame separator, composed of a work stocker which holds laminated work of strips; a work-pressing mechanism which continuously presses the work within the work stocker; a separating mechanism which strips away the laminated work piece by piece from the lowest part thereof; and a pusher mechanism which pushes outside the stripped work from the work stocker; and wherein the separating mechanism is installed with a detector which finds out double sheets of the strips and stops operation of the pusher; and the separator is installed at its work exit end with a positioning pin of go-in-and-out of a taper shape which positions end points of the work pushed out by the pusher.

2. A device as claimed in claim 1, wherein the work-pressing mechanism goes down by its own weight and presses the laminated work.

3. A device as claimed in claim 1, wherein the amount of pushing the work by the pusher is adjustable.

4. A device as claimed in claim 1, wherein a detector finds out double sheets of the strips by detecting changes of inductance.

* * * * *